US011877387B2

(12) United States Patent
Winterschladen et al.

(10) Patent No.: US 11,877,387 B2
(45) Date of Patent: Jan. 16, 2024

(54) MACHINING STATION AND METHOD FOR CONTROLLING OR IDENTIFYING PLATELIKE WORKPIECES

(71) Applicant: Schmoll Maschinen GmbH, Rödermark-Oberroden (DE)

(72) Inventors: Markus Winterschladen, Kahl (DE); Abdullah Taymuree, Groß-Zimmern (DE); Peter Knief, Frankfurt am Main (DE)

(73) Assignee: SCHMOLL MASCHINEN GMBH, Rödermark (DE)

( * ) Notice: Subject to any disclaimer, the term of this patent is extended or adjusted under 35 U.S.C. 154(b) by 244 days.

(21) Appl. No.: 17/317,150

(22) Filed: May 11, 2021

(65) Prior Publication Data
US 2021/0360776 A1  Nov. 18, 2021

(30) Foreign Application Priority Data
May 14, 2020  (DE) .......................... 102020113109.7

(51) Int. Cl.
H05K 1/02 (2006.01)
G01N 23/083 (2018.01)
(Continued)

(52) U.S. Cl.
CPC ......... *H05K 1/0269* (2013.01); *G01N 23/083* (2013.01); *G06T 7/0004* (2013.01);
(Continued)

(58) Field of Classification Search
CPC .. H05K 1/0269; H05K 3/0008; H05K 3/0047; H05K 2201/09918; H05K 3/0044;
(Continued)

(56) References Cited

U.S. PATENT DOCUMENTS 10,215,716 B2  2/2019  Tingay
10,393,675 B2  8/2019  Tingay
(Continued)

FOREIGN PATENT DOCUMENTS

CN     101375648 B     9/2010
DE    102004049439 A1   4/2006
(Continued)

*Primary Examiner* — Sheela C Chawan
(74) *Attorney, Agent, or Firm* — McDonnell Boehnen Hulbert & Berghoff LLP

(57) ABSTRACT

The present disclosure relates to a machining station for machining platelike workpieces (1) by means of at least one tool, in particular a drilling station for machining at least one circuit board, as well as to a method for controlling or identifying a platelike workpiece (1). The machining station has at least one X-ray radiation source (3), at least one detector (4) and a table (2) that can be positioned between the X-ray radiation source (3) and the detector (4), on which the workpiece (1) to be machined can be fastened. The table (2) has a receiving plate (6) made out of a material permeable to X-rays (5), in particular a plastic. The receiving plate (6) has at least one suction port (11) for extracting air and a distribution grid, which is connected in terms of flow with the at least one suction port (11) and consists of several channels (10) unilaterally open in a support surface (9) with beveled and/or rounded edges (13) and/or of inclinedly running through openings (14).

10 Claims, 4 Drawing Sheets

(51) Int. Cl.
*G06T 7/00* (2017.01)
*H05K 3/00* (2006.01)

(52) U.S. Cl.
CPC ......... *H05K 3/0008* (2013.01); *H05K 3/0047* (2013.01); *G06T 2207/30141* (2013.01); *G06T 2207/30164* (2013.01); *H05K 2201/09918* (2013.01)

(58) Field of Classification Search
CPC ........... G01N 23/083; G01N 2223/309; G01N 23/04; G01N 2223/03; G01N 2223/1016; G06T 7/0004; G06T 2207/30141; G06T 2207/30164
USPC ........................................ 382/100, 145, 151
See application file for complete search history.

(56) References Cited

U.S. PATENT DOCUMENTS

| | | | | |
|---|---|---|---|---|
| 2002/0050055 | A1* | 5/2002 | Ishizaka | H05K 3/0008 |
| | | | | 29/650 |
| 2004/0016116 | A1* | 1/2004 | Yeh | B23K 26/351 |
| | | | | 29/846 |
| 2005/0115375 | A1* | 6/2005 | Dick | B27M 1/08 |
| | | | | 29/563 |
| 2006/0253270 | A1* | 11/2006 | Nguyen | H05K 3/4638 |
| | | | | 703/2 |
| 2007/0240547 | A1* | 10/2007 | Dick | B27M 1/08 |
| | | | | 83/76.1 |
| 2007/0256298 | A1 | 11/2007 | Reinhold | |
| 2010/0154184 | A1* | 6/2010 | Kunz | H05K 3/0047 |
| | | | | 408/1 R |
| 2017/0011973 | A1 | 1/2017 | Tingay | |
| 2020/0083124 | A1* | 3/2020 | Yang | H01L 21/78 |

FOREIGN PATENT DOCUMENTS

| | | |
|---|---|---|
| JP | 2007134391 A | 5/2007 |
| JP | 2007201349 A | 8/2007 |
| JP | 2009112985 A | 5/2009 |
| JP | 2015195276 A | 11/2015 |
| JP | 2017510820 A | 4/2017 |

\* cited by examiner 16    17    16

MACHINING STATION AND METHOD FOR CONTROLLING OR IDENTIFYING PLATELIKE WORKPIECES

CROSS-REFERENCE TO RELATED APPLICATIONS

The present application claims priority to and the benefit of German Patent Application No. 10 2020 113 134.8 filed on May 14, 2020, the entire contents of which are incorporated herein by reference.

FIELD

The present disclosure relates to a machining station for machining platelike workpieces by means of tools, for example a drilling or milling station for machining circuit boards, as well as to a method for controlling or identifying platelike workpieces.

BACKGROUND

X-ray material testing is basically known in many applications. For this purpose, X-rays are generated in an X-ray tube and guided through a workpiece. Depending on the thickness and density of the irradiated material, this radiation weakens to a varying extent. Comparatively softer material, such as the composites made of epoxy resin and fiberglass fabric (FR4) used for manufacturing circuit boards, absorb little radiation, while comparatively harder materials, such as copper, absorb a lot of radiation. Depending on the density and thickness of the examined material, dark to bright structures can be differentiated on the X-ray image.

Circuit boards have to date been controlled using a receiving plate of the machine bench made out of aluminum, which serves to clamp in the circuit boards. The circuit boards can be held on the receiving plate by a vacuum. This known receiving plate essentially consists of a frame, for example of 40 mm thick aluminum, a measuring area, and a vacuum area. X-ray images cannot be generated in the area of the frame, since the thick aluminum completely absorbs the X-rays. X-ray images can only be generated in a measuring area designed as a free space (an opening within the frame), so that the X-rays can pass through unimpeded and generate X-ray images. Since the measuring area is limited, the circuit boards cannot be completely analyzed. The vacuum field is not distributed over the entire plate, but rather located only in the frame. As a consequence, the circuit boards are only partially clamped. These known frame-like receiving plates made out of aluminum are as a rule also not used for further machining in a drilling or milling station, so that the workpieces must be re-clamped.

SUMMARY

By contrast, the object of the present disclosure is to provide a machining station, such as an X-ray drilling machine, in which a circuit board for X-ray material testing can be completely inspected and quickly and securely fixed in place. Another object of the disclosure lies in providing a method with which a circuit board can be quickly and reliably controlled and identified.

This object is achieved according to the disclosure with a machining station according to claim 1. Advantageous embodiments are indicated in the subclaims.

For example, a machining station for machining platelike workpieces by means of at least one tool is a drilling station, in particular an X-ray drilling machine, for machining at least one circuit board, which additionally has an X-ray machine. In other words, the machining station is provided with at least one X-ray radiation source, at least one detector, and a table that can be positioned between the X-ray radiation source and the detector, on which the workpiece to be machined can be clamped. The table preferably has a receiving plate made out of a material permeable to X-rays, such as plastic. As a result, the workpiece to be machined can be controlled or inspected via X-ray radiation without the receiving plate impeding the X-ray radiation.

In addition, the receiving plate is provided with at least one suction port for extracting air. The suction port is here connected in terms of flow with a distribution grid, which consists of several channels and/or through openings. For example, these channels are formed in a support surface of the receiving plate as depressions that are unilaterally open, e.g., facing the X-ray radiation source. The vacuum receiving plate can have lateral ports for a vacuum pump, for example. The vacuum distribution grid makes it possible to generate a full-surface vacuum field. Alternatively or additionally, a plurality of through openings, e.g., round ones, can yield a flat aspiration of the workpiece via a grid.

According to the disclosure, the edges bordering the channels have bevels or rounded areas, so as not to produce any sharp edges. The objective is here not to generate any visible transition at the edges during the evaluation. The channels basically result in differences in material thickness, leading to a situation in which the areas lying between the channels generate contrasts in the image converter. Due to the bevel or rounded area, the edges are not sharply imaged, and image processing is not disrupted, for example if an edge is detected.

If through openings are used in the table in a support surface that receives the workpiece, they preferably run inclined to the support surface. This also avoids differences in material thickness, and thus contrasts in the image converter.

In other words, it is therefore a central aspect of the present disclosure that the table which serves as a support for the workpiece during the X-ray examination not have any sharp-edged differences in material thickness and differences in material that could generate sharp-edged contrasts in the image converter in the area where the workplace is placed. This is achieved by beveled or rounded edges in linear channels and/or by inclinedly running bores.

As opposed to known aluminum frames, the table according to the disclosure is conceived in such a way that even though the frame, measuring area and vacuum area overlap each other, all functions are completely available without limitation. In other words, the entire table can be used as a measuring area, and simultaneously has a full-surface vacuum for clamping the circuit boards.

In addition, this makes it possible to perform other machining steps directly on this table, without having to re-clamp the workpiece on another table. To this end, it can be advantageous already during the X-ray examination to provide a so-called backup layer between the workpiece and the table. It was surprisingly found that this backup layer does not impede the X-ray examination, and can even improve the fixation of the workpiece on the table. To this end, the backup layer is preferably permeable to air, for example in the form of a layer consisting of pressed wood.

For example, the distribution grid defines cuboid or cube-shaped support elements with beveled or rounded edges between the channels. Beveled edges are here initially understood as all nonrectangular edges, i.e., beveled or broken edges as well as rounded edges and combinations thereof. In particular, the channels can taper from the unilaterally open side to the groove base. In preferred embodiments, the channels can have a depth of about 3 mm to about 10 mm, in particular of about 5 mm. In particular, the vacuum distribution grid formed by the channels can be formed by channels that are perpendicular or parallel to each other. However, other orientations of the channel that generate a full-surface vacuum field are also possible.

For several applications, it may be advantageous for the receiving plate to have a carrier frame, which surrounds the support surface provided with the distribution grid. In this way, the frame can be advantageous in forming the suction ports. In addition, sealants can be provided in the area of the frame. The carrier frame and support surface are preferably integral in design. Alternatively, the receiving plate can also be multipart.

In a preferred embodiment, the table consists of two plates. In the installation position, the lower plate is the (vacuum) receiving plate, and the upper plate is a cover plate. To prevent the X-rays from being absorbed by the plates, the plates are made out of plastic materials, for example. If the table in the machining station according to the disclosure also has a cover plate that can be fastened to the receiving plate, the cover plate is advantageously provided with a plurality of through openings (vacuum bores), which are connected in terms of flow with the distribution grid. This makes it possible to aspirate air through the through openings into the channels, and from there via the suction ports. As a result, a workpiece lying on the cover plate is tightly vacuumed, and thereby fixated.

For example, the cover plate is mounted on the vacuum receiving plate with plastic screws. This seals the vacuum receiving plate. To ensure that the vacuum circuit is completely closed and cannot draw any foreign air, a sealing cord made of rubber is preferably laid around the vacuum distribution grid.

The cover plate should also not generate any sharp-edged contrasts in the X-ray image that would impede an evaluation. Therefore, the vacuum bores are not perpendicularly introduced into the cover plate, but rather fabricated at about 45°. The through openings can run inclined relative to the cover plate by between 200 and 70°.

A perpendicular bore generates a difference in material thickness, which in turn generates contrast in the image converter in the form of a circle. By contrast, the inclinedly secured bores reduce the difference in material thickness and change the contrast shape that arises in the image converter. The resultant X-ray image is thus not shaped like a circle, but like an oblong hole. Circular fiducial markers are very often used for analyzing a circuit board. The oblong hole-shaped X-ray image of the vacuum bore does not disrupt this type of image processing, for example when a circle is detected.

If the workpieces are machined, e.g., drilled, on the table, openings can be provided in the table at locations provided for the bores. As a result, a tool exiting the workpiece does not damage the table. The openings can be a passage hole or blind hole. In order to avoid contrasts from such openings, the openings can be closed by movable bushings.

The machining station can further have an evaluation device that has an image converter and/or an image processing device, and is connected with the detector. Alternatively or additionally, the machining station can have a data processing device for registering a workpiece as a function of the signals received by the detector.

A method according to the disclosure is used to control or identify platelike workpieces, such as circuit boards, in particular in a machining station of the kind mentioned above. In other words, the method can be used both to register and identify a circuit board by using an inner structure not visible from the outside for identification based on the discovered copper pads and boreholes, as well as to control and verify preceding machining steps or to calibrate for future machining steps.

The method preferably comprises the following steps: a) Placing a workpiece on a receiving plate of a table made out of a material permeable to X-rays, wherein the receiving plate has at least one suction port and a distribution grid that is connected in terms of flow with the at least one suction port and consists of several unilaterally open channels with beveled or rounded edges, b) fixing the workpiece on the table by aspirating air out of the suction port and the distribution grid, c) positioning the table with the workpiece between at least one X-ray radiation source and at least one detector, d) generating X-rays by means of the at least one X-ray radiation source and detecting the X-rays that were not absorbed by the table and the workpiece by means of the detector, and e) evaluating the signals of the detector in a data processing device for controlling or identifying the workpiece.

The steps of the method are preferably performed chronologically in the sequence mentioned above. However, it can make sense in some instances to switch individual steps in the sequence, e.g., steps b) and c), and/or to repeat individual or several steps. For example, steps d) and e) can be followed by machining the workpiece by means of at least one tool. Steps d) and e) can be repeated after a machining of the workpiece.

It is preferred that steps d) and e) be taken as the basis for workpiece registration, which is used for identifying the workpiece for machining by means of at least one tool.

The disclosure will be described in more detail below based on exemplary embodiments and the drawing. All described and/or graphically depicted features here comprise the subject matter of the disclosure, whether taken separately or in any combination, regardless of how summarized in the claims or back referenced.

DETAILED DESCRIPTION

Figure 1:
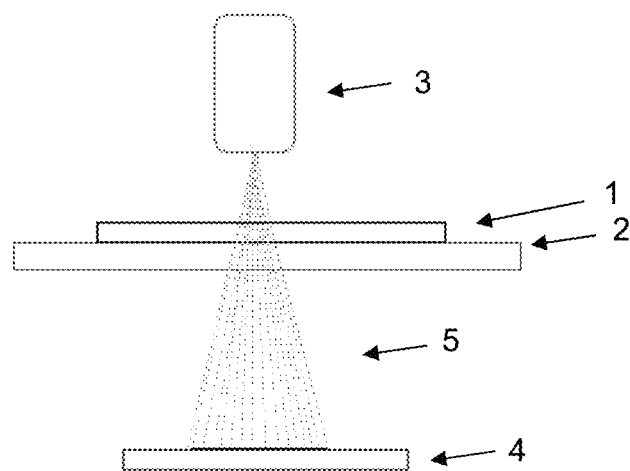
FIG. 1 is a side view of a basic representation of the digital X-ray.

FIG. 1 schematically depicts the basic principle underlying nondestructive material testing via digital X-rays. To this end, a workpiece 1 is positioned on a table 2 between an X-ray radiation source 3 and a detector 4, so that the X-rays 5 can penetrate through the workpiece 1 and the table 2. The X-rays 5 are partially absorbed both by the workpiece 1 and the table 2. Differences within the workpiece 1, for example various materials or cavities, result in a varying absorption of X-rays 5, and can thus be discerned by means of the detector as brighter or darker structures.

As evident from the illustration on FIG. 1, the table 2 should allow for as uniform an absorption of X-rays 5 as possible to precisely inspect the workpiece 1. Strong differences in the density and/or thickness of the material of the table 2 would manifest themselves on the X-ray image as dark to bright structures, which would be superposed with correspondingly brighter or darker structures based on the absorption within the workpiece 1.

Figure 2:
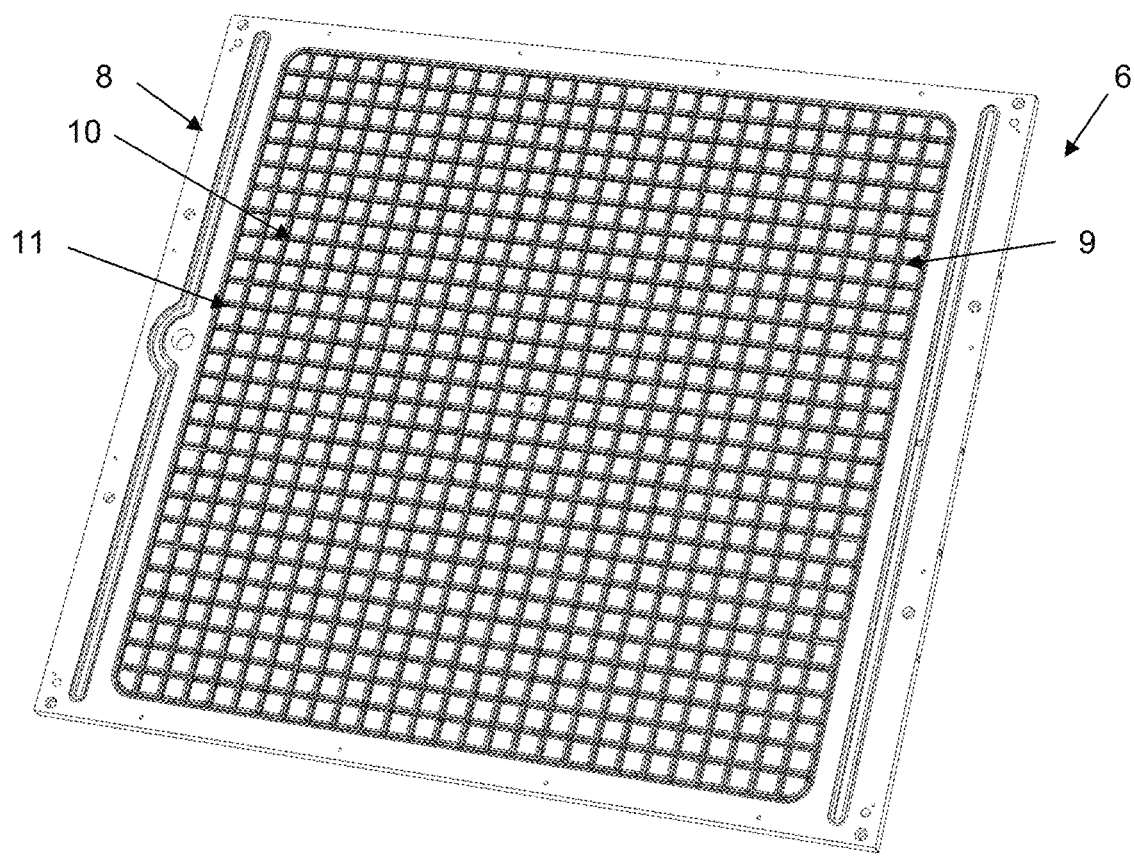
FIG. 2 is a top view of a receiving plate according to an embodiment of the disclosure.
Figure 4:
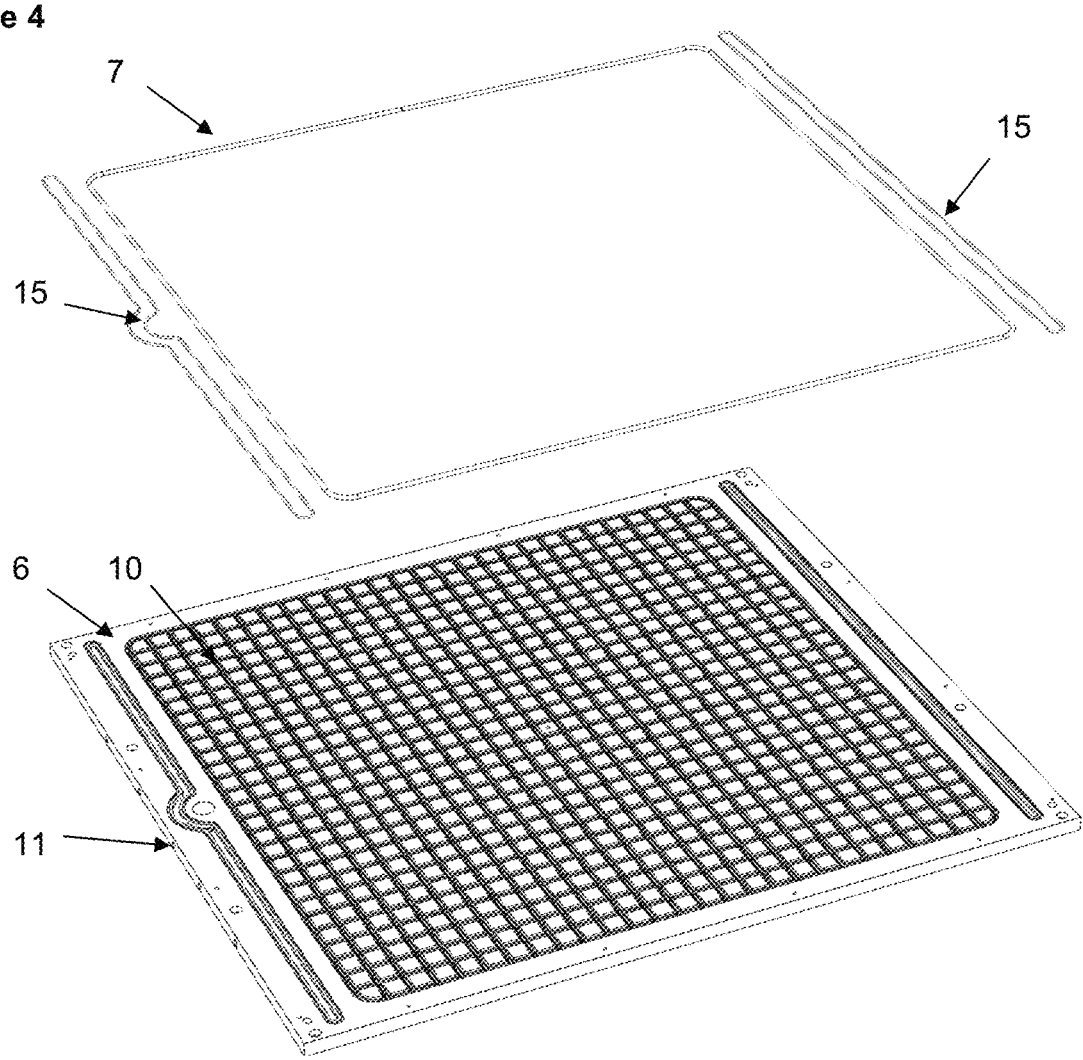
FIG. 4 is a perspective view of the components of a table according to an embodiment of the disclosure.

In an embodiment of the disclosure, the table 2 has a two-part structure, specifically having a receiving plate 6 and a cover plate 7, which can be joined together tightly as denoted on FIG. 4. FIG. 2 shows a top view of the receiving plate 6. The receiving plate 6 here has an essentially closed outer frame 8 as well as a support surface 9, which is enclosed by the frame 8. The support surface 9 has a plurality of channels 10, which are arranged parallel and perpendicular to each other in a vacuum distribution grid. The channels 10 are connected in terms of flow with suction ports 11, so that air can be aspirated via the channels 10 and suction ports 11.

Figure 3:
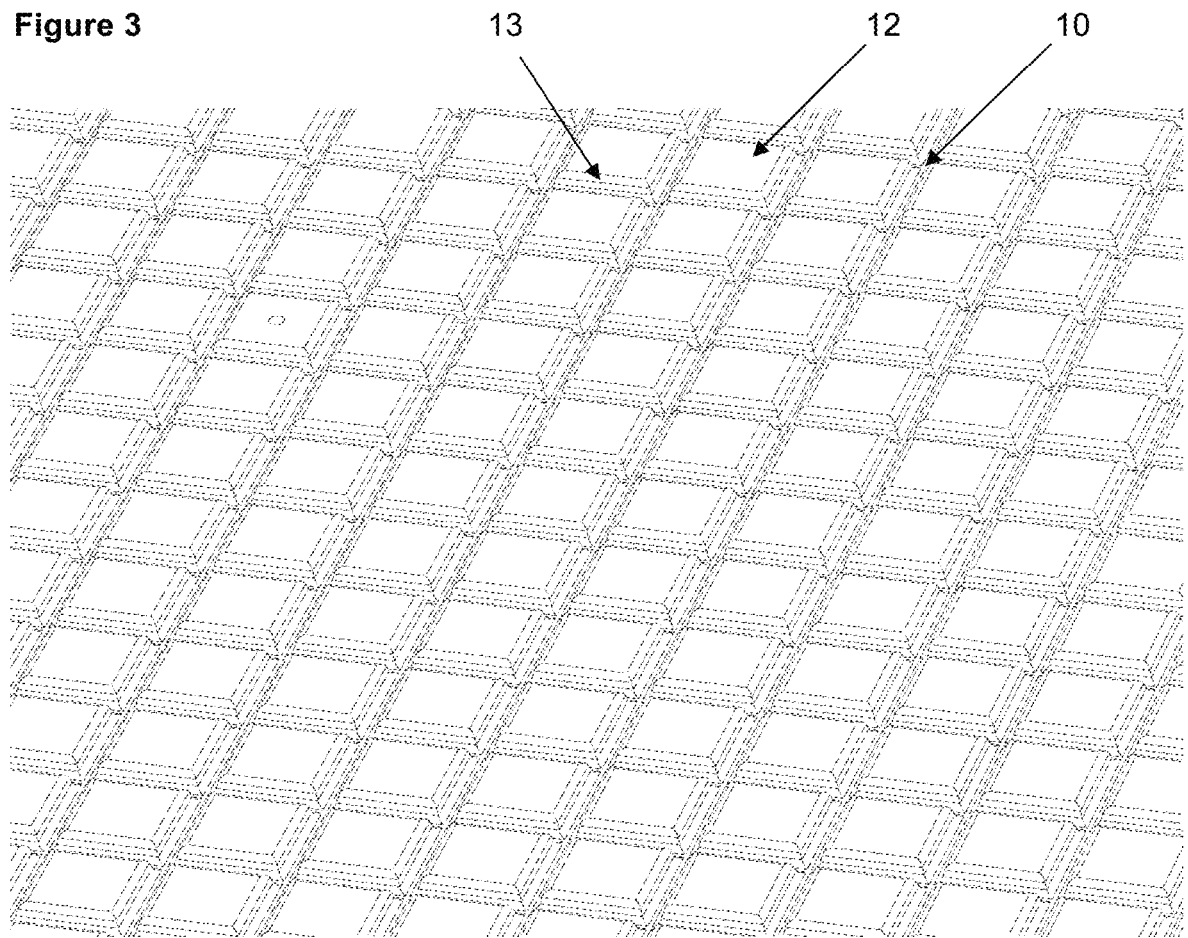
FIG. 3 is a magnified detail from FIG. 2.

As evident from the magnified illustration on FIG. 3, the channels 10 are designed as grooved depressions, which are unilaterally open toward the support surface 9. The material thickness of the receiving plate 6 is thus reduced by the channels 10, wherein cuboid elements 12 (cubes) are formed between the channels 10 in the embodiment shown. However, the edges 13 of these cuboid elements 12 are not rectangular, but rather beveled or rounded or broken. The cuboid elements 12 hence have no sharp edges, but a bevel, so that no transition visible in the X-ray image is generated at the edges 13. For example, the channels 10 around the cuboid elements 12 are about 5 mm deep, so that even though contrasts are generated in the image converter by the differences in material thickness, they are not sharply imaged due to the bevel at the respective edge 13, and image processing is not disrupted. This enables an error-free edge detection of the workpiece 1.

Figure 5:
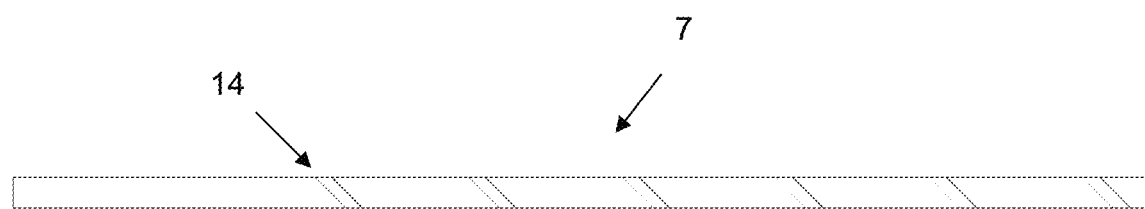
FIG. 5 is a magnified sectional view of the cover plate of the table from FIG. 4.

Cutouts of the cover plate 7 are shown on FIG. 5 in cross section. As evident from this view, the cover plate 7 has a plurality of through openings 14, which connect the channels 10 of the receiving plate 6 with the environment (top of FIG. 5). The cross section of the through openings 14 is here distinctly smaller than the width of the channels 10, so that the through openings 14 serve as small nozzles or vacuum bores, which aspirate air in the channels 10. For sealing purposes, sealing cords 15 can be provided between the receiving plate 6 and the cover plate 7.

In the embodiment shown, the special feature of the cover plate 7 involves the alignment of vacuum bores. These through openings 14 of the cover plate are not perpendicular, but fabricated at 45°. A perpendicular bore or opening produces a difference in material thickness, which in turn generates a contrast in the image converter in the shape of a circle. For example, this would be disruptive given a circle detection, which for the analysis of a circuit board frequently also takes place based on circular fiduciary markers. By contrast, the inclined openings 14 reduce the difference in material thickness, and change the contrast shape that arises in the image converter.

Figure 6:
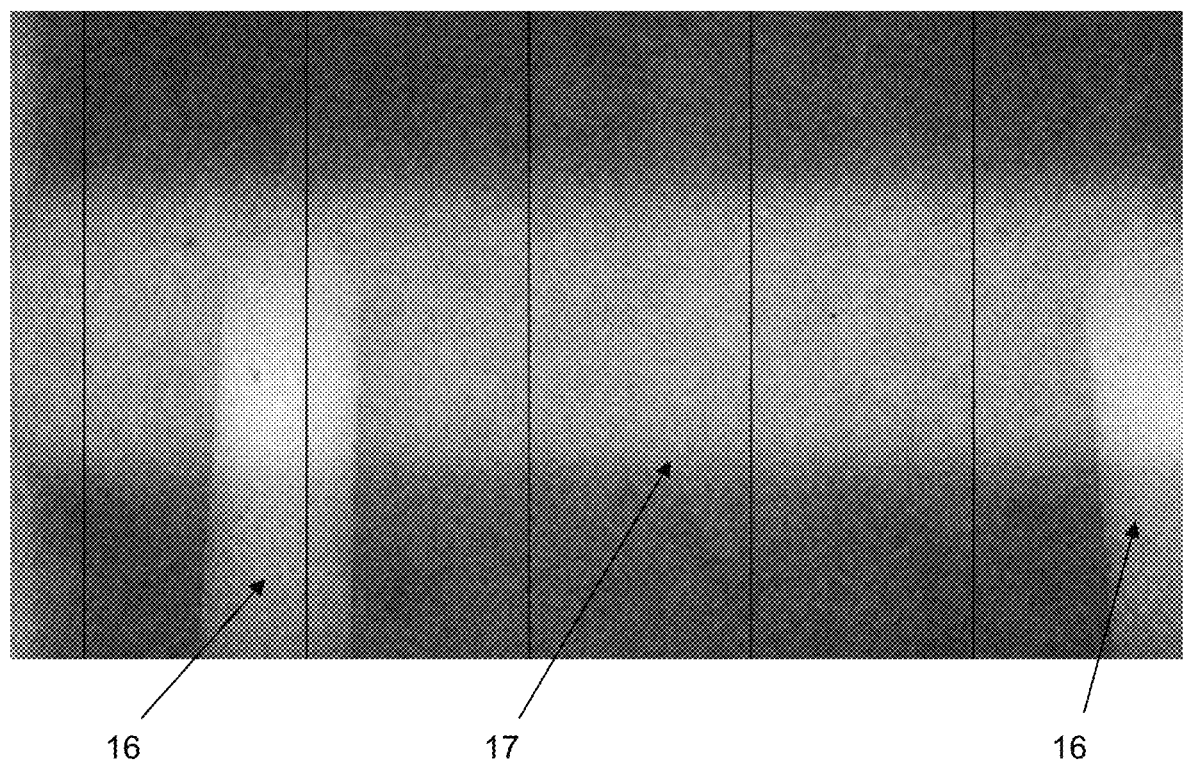
FIG. 6 is a cutout of an X-ray image of the table according to the disclosure.

The resultant X-ray image is not shaped like a circle, but rather like a brighter oblong hole 16 on FIG. 6. The oblong hole-shaped X-ray image of the vacuum bore does not disrupt image processing. As also evident on FIG. 6, the transition 17 between a channel 10 and a cuboid element 12 does not stand out sharply in the X-ray image owing to the beveled edges 13.

As a consequence, the table 2 designed according to the disclosure as exemplarily shown makes it possible to non-destructively inspect a workpiece 1, for example a circuit board by means of X-rays 5, and precisely detect copper pads or cavities in the process. At the same time, the configuration of the table 2 allows the workpiece 1 to be quickly and securely fixed on the table 2 by means of a vacuum. This fixation is so strong that the workpiece 1 can also be machined while fastened to the table 2 by means of vacuum, for example by introducing bores.

The workpiece 1 can here be inspected by means of X-rays 5 not just to control the workpiece 1 before and/or after machining, but can also be used to identify and register a workpiece 1. Based on previously known information about the inner composition of a workpiece 1, for example the number and position of cavities or material differences, a workpiece can in this way be identified and registered for subsequent machining steps through inspection by means of X-rays 5.

Deviating from the illustration on FIG. 1, in which a workpiece 1 to be machined is arranged directly on the table 2, a so-called backup element can be provided between the table 2 and the workpiece 1, into which a drill can penetrate while machining the workpiece 1 without damaging the table 2. It has here proven to be especially advantageous for the backup element to be permeable to air, e.g., as a diffuse layer of pressed wood, so that exposing the table 2 to vacuum suction fixes the backup element, and the latter the workpiece, on the table.

The invention claimed is:

1. A machining station for machining platelike workpieces (1) by means of at least one tool, in particular a drilling station for machining at least one circuit board, with at least one X-ray radiation source (3), at least one detector (4) and a table (2) that can be positioned between the X-ray radiation source (3) and the detector (4), on which the workpiece (1) to be machined can be fastened, characterized in that the table (2) has a receiving plate (6) made out of a material permeable to X-rays (5), in particular a plastic, and that the receiving plate (6) has at least one suction port (11) for extracting air and a distribution grid, which is connected in terms of flow with the at least one suction port (11) and consists of several channels (10) unilaterally open in a support surface (9) with beveled and/or rounded edges (13) and/or of inclinedly running through openings (14).

2. The machining station according to claim 1, characterized in that the distribution grid defines cuboid support elements (12) with beveled and/or rounded edges (13) between the channels (10).

3. The machining station according to claim 1, characterized in that the channels (10) have a depth of about 3 mm to about 10 mm, in particular of about 5 mm.

4. The machining station according to claim 1, characterized in that the receiving plate (6) has a carrier frame (8), which surrounds the support surface (9) provided with the distribution grid.

5. The machining station according to claim 1, characterized in that the table (2) additionally has a cover plate (7) that can be fastened to the receiving plate (6), wherein the cover plate (7) is provided with a plurality of through openings (14), which are connected in terms of flow with the distribution grid.

6. The machining station according to claim 5, characterized in that the through openings (14) run inclined relative to the cover plate (7) by between 20° and 70°, for example by about 45°.

7. The machining station according to claim 5, characterized in that the receiving plate (6) is sealed relative to the cover plate (7) by means of at least one sealing cord (15).

8. The machining station according to claim 1, characterized in that the table (2) has openings that can be closed by movable bushings.

9. The machining station according to claim 1, which further has an evaluation device that has an image converter and/or an image processing device, and is connected with the detector (4).

10. The machining station according to claim 1, which further has a data processing device for registering a workpiece as a function of signals received by the detector (4).

* * * * *